(12) United States Patent
Miyanishi (10) Patent No.: US 7,203,870 B2
(45) Date of Patent: Apr. 10, 2007

(54) SEMICONDUCTOR MEMORY UNIT WITH REPAIR CIRCUIT

(75) Inventor: Atsushi Miyanishi, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 607 days.

(21) Appl. No.: 10/330,165

(22) Filed: Dec. 30, 2002

(65) Prior Publication Data

US 2004/0078701 A1    Apr. 22, 2004

(30) Foreign Application Priority Data

Jul. 15, 2002    (JP) ............................. 2002-205795

(51) Int. Cl.
*G11C 29/24*    (2006.01)
*G11C 29/20*    (2006.01)

(52) U.S. Cl. ...................................... 714/710; 714/718
(58) Field of Classification Search ................ 714/710, 714/718, 730, 733, 763, 2, 5, 6, 8, 42, 54, 714/702; 365/200, 201
See application file for complete search history.

(56) References Cited

U.S. PATENT DOCUMENTS 4,310,901 A * 1/1982 Harding et al. ............. 714/710
6,178,125 B1 * 1/2001 Niiro .......................... 365/200
6,603,691 B2 * 8/2003 Yoo et al. .................... 365/201
6,754,746 B1 * 6/2004 Leung et al. ................ 710/100

FOREIGN PATENT DOCUMENTS

JP    2000215666 A    *    8/2000

* cited by examiner

*Primary Examiner*—Albert Decady
*Assistant Examiner*—Dipakkumar Gandhi
(74) *Attorney, Agent, or Firm*—Buchanan Ingersoll & Rooney PC (57) ABSTRACT

A semiconductor memory unit with a repair circuit includes a controller, a 2-to-1 selector, an address decoder and an address comparator. The controller supplies the 2-to-1 selector and the address comparator with a setup signal to carry out the following control. When the 2-to-1 selector is controlled to supply the address decoder with a repair address signal, the address comparator is controlled to have a repair signal information holding section, which is installed in the address comparator, hold the repair address decoded by the address decoder. When the 2-to-1 selector is controlled to supply the address decoder with a read/write address signal, the address comparator is controlled to compare the read/write address with the repair address. The semiconductor memory unit can obviate the need for a repair address decoder, thereby reducing the unit area.

5 Claims, 10 Drawing Sheets

SEMICONDUCTOR MEMORY UNIT WITH REPAIR CIRCUIT

BACKGROUND OF THE INVENTION

1. Field of the Invention

The present invention relates to a semiconductor memory unit with a repair circuit.

2. Description of Related Art

Figure 13:
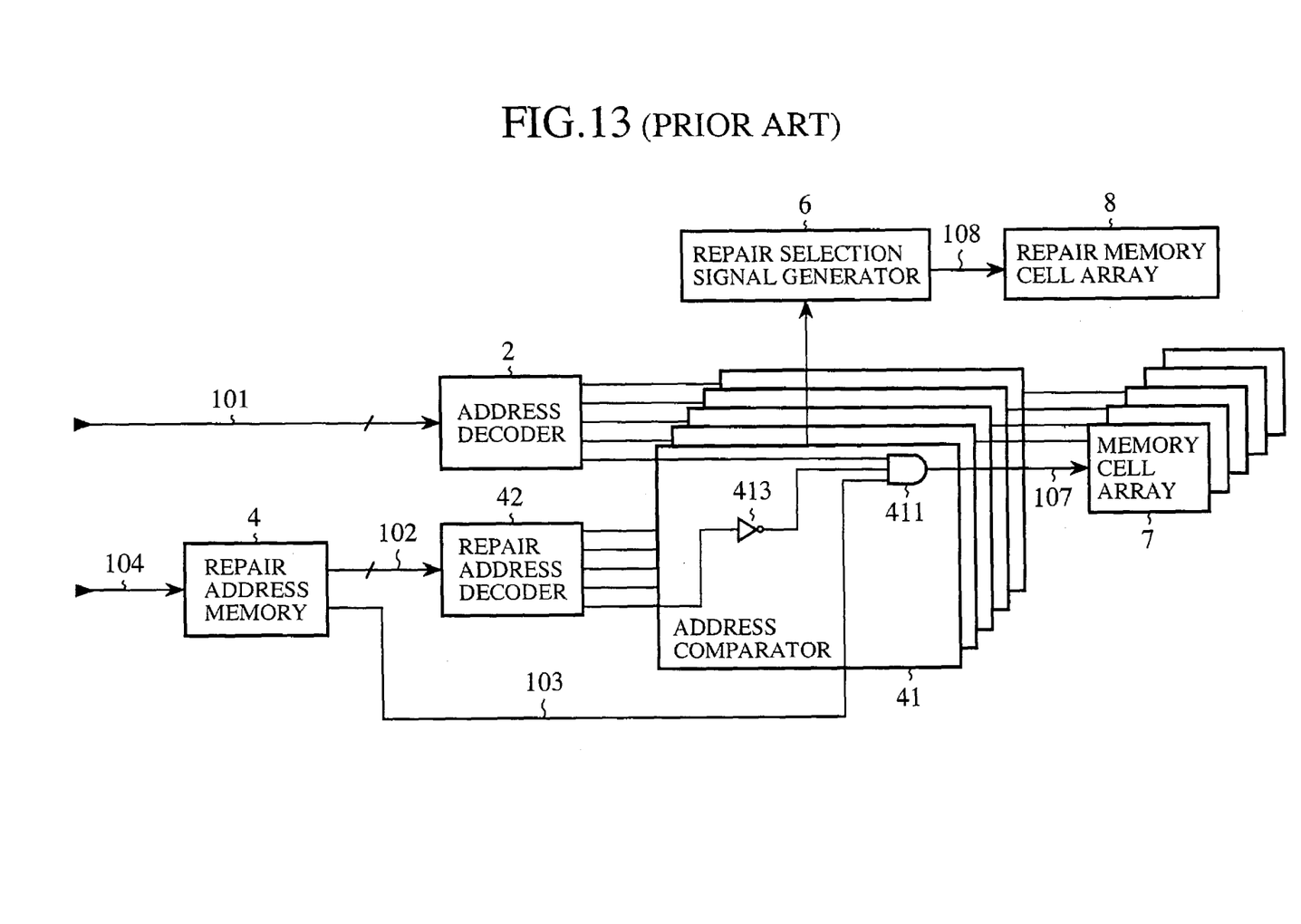
FIG. 13 is a block diagram showing a configuration of a conventional semiconductor memory unit with a repair circuit.

FIG. 13 is a block diagram showing a configuration of a conventional semiconductor memory unit with a repair circuit. In FIG. 13, the reference numeral 41 designates an address comparator, 2 designates an address decoder, 4 designates a repair address memory, 6 designates a repair selection signal generator, 7 designates a memory cell array, 8 designates a repair memory cell array, and 42 designates a repair address decoder. The address comparator 41 includes an AND gate 411 and an inverter 413.

Next, the operation of the conventional semiconductor memory unit will be described.

The address decoder 2 decodes a read/write address signal 101 supplied from the outside. The read/write address signal 101 is a signal for determining the address of a read/write memory cell. On the other hand, the repair address decoder 42 always decodes a repair address signal 102 output from the repair address memory 4. The repair address signal 102 is a signal for indicating the address of a memory cell to be repaired.

Receiving the repair address signal 102 decoded by the repair address decoder 42 and the read/write address signal 101 decoded by the address decoder 2, the address comparator 41 compares them. In the course of this, the repair address memory 4 supplies the address comparator 41 with a repair activating signal 103 indicating the necessity of using the repair circuit. When the address the output signal of the address decoder 2 points agrees with the address the output signal of the repair address decoder 42 points, and when the repair activating signal 103 selects the use of the repair circuit, the address comparator 41 has the repair selection signal generator 6 supply the repair memory cell array 8 with a repair memory cell selection signal 108. The repair memory cell selection signal 108 is a signal for activating the repair memory cell corresponding to the selected address. In contrast, when the compared result indicates that the addresses disagree, or when the repair activating signal 103 indicates that the repair circuit is not to be used, the address comparator 41 supplies the memory cell selection signal 107 to the memory cell array 7. The memory cell selection signal 107 is a signal for activating the memory cell corresponding to the selected address.

With the foregoing configuration, the conventional semiconductor memory unit with a repair circuit has a problem of increasing the area of the unit because it must include the repair address decoder 42 besides the normal address decoder 2.

SUMMARY OF THE INVENTION

The present invention is implemented to solve the foregoing problem. It is therefore an object of the present invention to provide a semiconductor memory unit with a repair circuit capable of obviating the repair address decoder and reducing the unit area.

According to one aspect of the present invention, there is provided a semiconductor memory unit with a repair circuit including a shared address decoder for decoding a read/write target memory address signal supplied from outside, and repair target memory address signal output from a repair address memory; a selector for selecting one of theses memory address signals; an address comparator for holding the repair target memory address decoded by the shared address decoder, and for comparing the repair target memory address with the read/write target memory address decoded by the shared address decoder; and a controller for supplying the selector and the address comparator with a control signal, wherein when the selector is controlled to supply the shared address decoder with the repair target memory address signal, the address comparator is controlled to hold the repair target memory address, and when the selector is controlled to supply the shared address decoder with the read/write target memory address signal, the address comparator is controlled to compare the read/write target memory address with the repair target memory address. It can obviate the need for installing the repair address decoder, and hence offers an advantage of being able to reduce the unit area.

DETAILED DESCRIPTION OF THE PREFERRED EMBODIMENTS

The invention will now be described with reference to the accompanying drawings.

Embodiment 1

Figure 1:
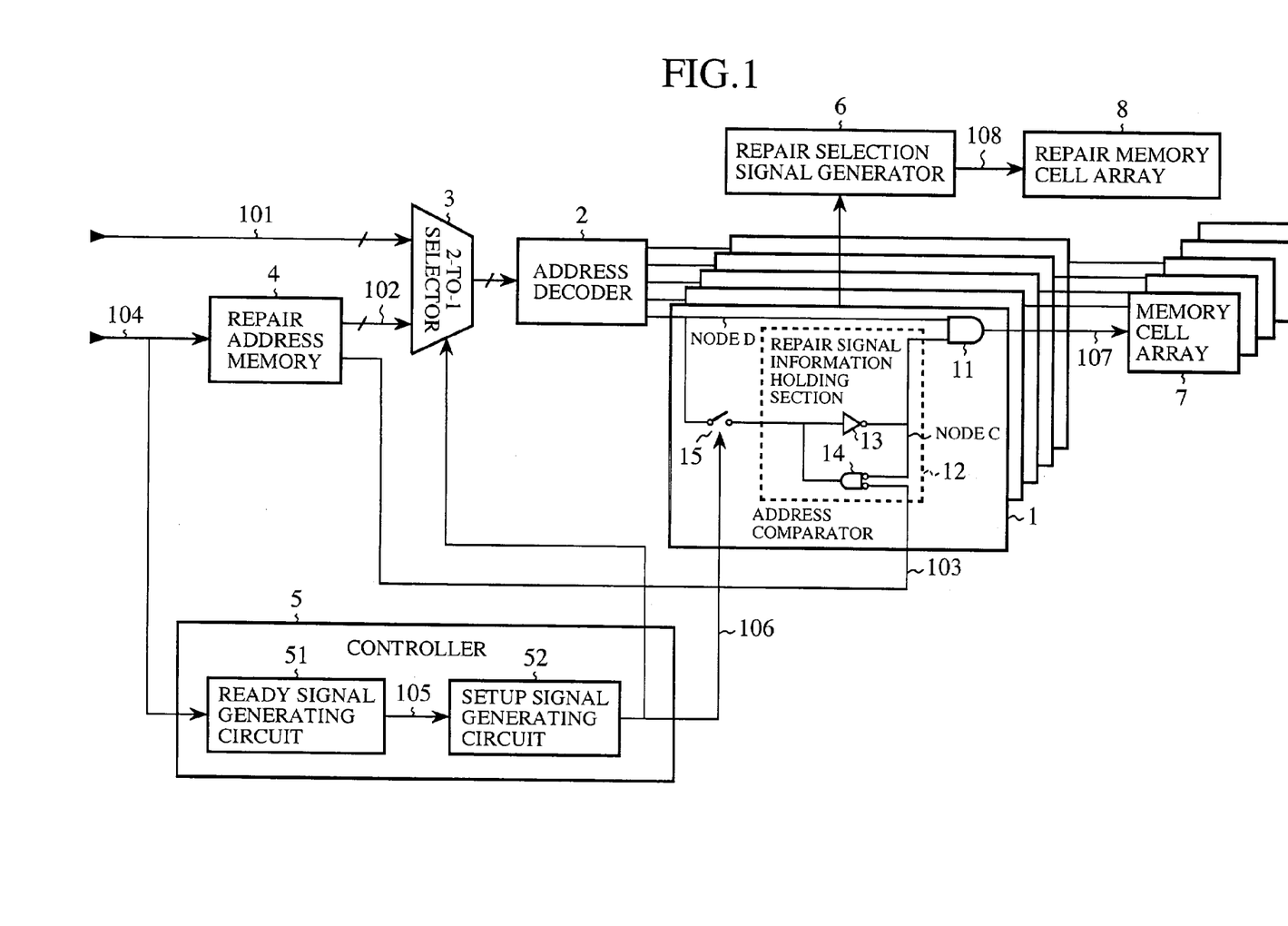
FIG. 1 is a block diagram showing a configuration of an embodiment 1 of a semiconductor memory unit with a repair circuit in accordance with the present invention.

FIG. 1 is a block diagram showing a configuration of an embodiment 1 of the semiconductor memory unit with a repair circuit in accordance with the present invention. In FIG. 1, the reference numeral 1 designates an address comparator, 2 designates an address decoder (shared address decoder), 3 designates a 2-to-1 selector, 4 designates a repair address memory, 5 designates a controller, 6 designates a repair selection signal generator, 7 designates a memory cell array, 8 designates a repair memory cell array, 11 designates an AND gate, 12 designates a repair signal information holding section, 13 designates an inverter, 14 designates a NOR gate, 15 designates a transmission gate, 51 designates a ready signal generating circuit and 52 designates a setup signal generating circuit.

The address comparator 1 includes the AND gates 11, repair signal information holding sections 12, and transmission gates 15. Each repair signal information holding section 12 includes the inverter 13 and NOR gate 14. The controller 5 includes the ready signal generating circuit 51 and setup signal generating circuit 52.

Next, the operation of the present embodiment 1 will be described.

Figure 2:
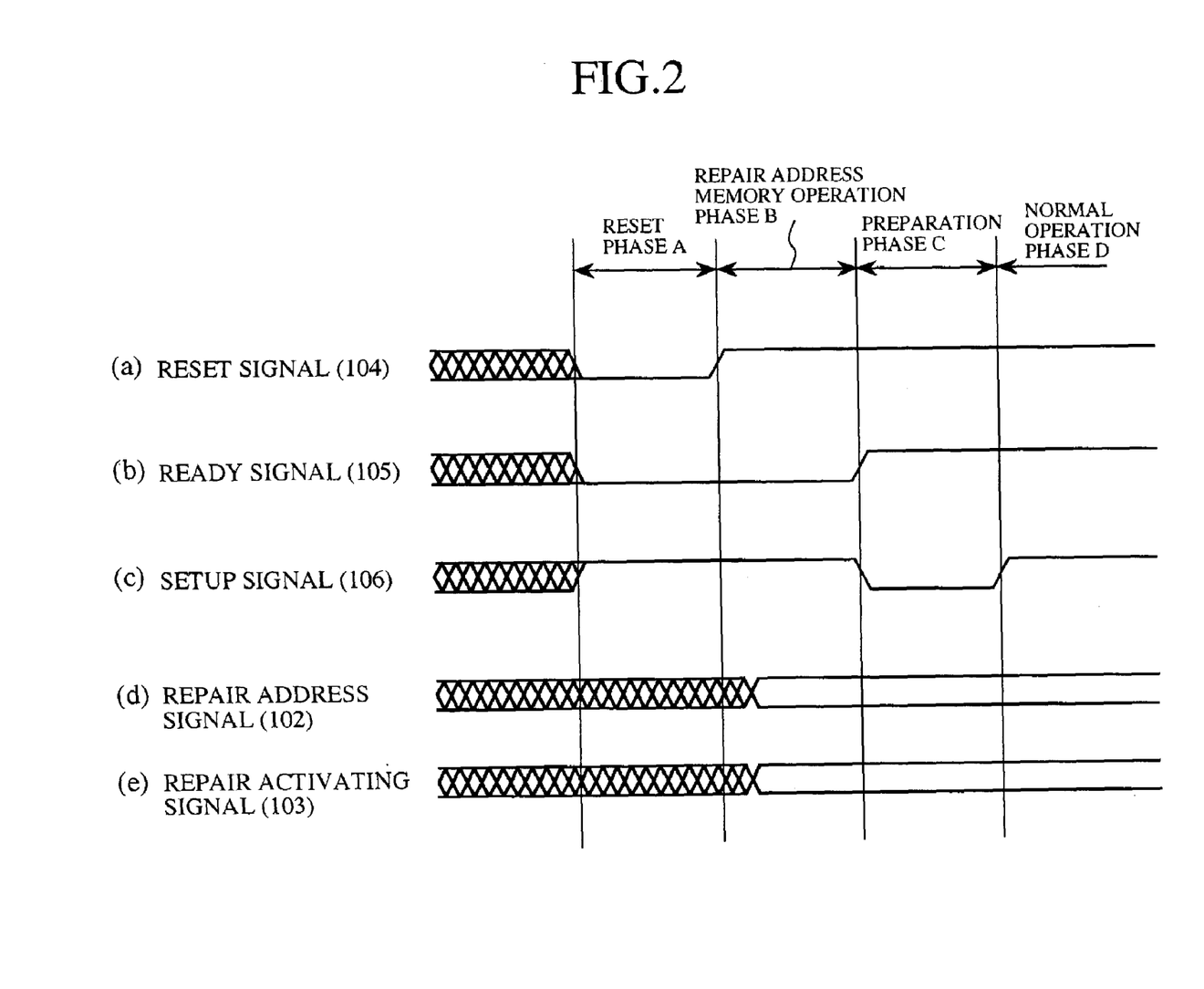
FIG. 2 is a timing chart illustrating the operation of the embodiment 1 of the semiconductor memory unit with a repair circuit.

FIG. 2 is a timing chart illustrating the operation of the present embodiment 1 of the semiconductor memory unit with a repair circuit in accordance with the present invention.

As illustrated in FIG. 2, the operation of the embodiment 1 of the semiconductor memory unit with a repair circuit has four phases. FIG. 2 illustrates the reset signal 104, ready signal 105, setup signal 106, repair address signal 102 (repair target memory address signal), and repair activating signal 103 (signal indicating whether to use the repair circuit or not) in individual phases. Referring to FIGS. 1 and 2, the operation in the individual phases will be described below.

Figure 3:
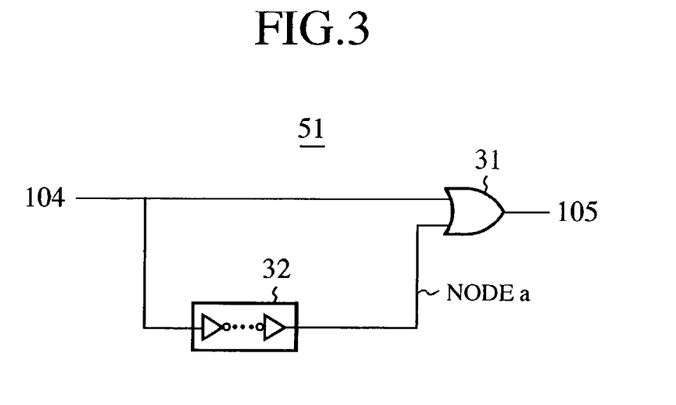
FIG. 3 is a block diagram showing a configuration of the ready signal generating circuit 51 of the embodiment 1.
Figure 4:
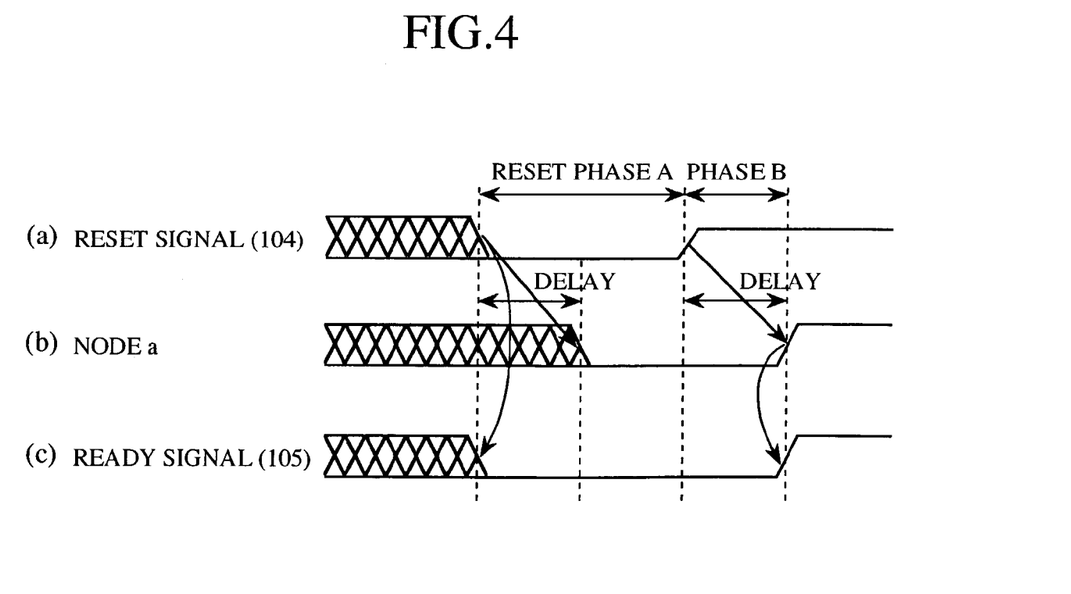
FIG. 4 is a timing chart illustrating the operation of the ready signal generating circuit 51 of the embodiment 1.

In the reset phases A, the reset signal 104 supplied from the outside of the unit is enabled. In response to it, the ready signal generating circuit 51 starts its operation, and makes the ready signal 105 busy. FIG. 3 shows the configuration of the ready signal generating circuit 51. In FIG. 3, the reference numeral 31 designates an OR gate, and 32 designates a delay circuit. FIG. 4 is a timing chart illustrating the operation of the ready signal generating circuit 51, in which the phase A must be longer than the phase B.

Figure 5:
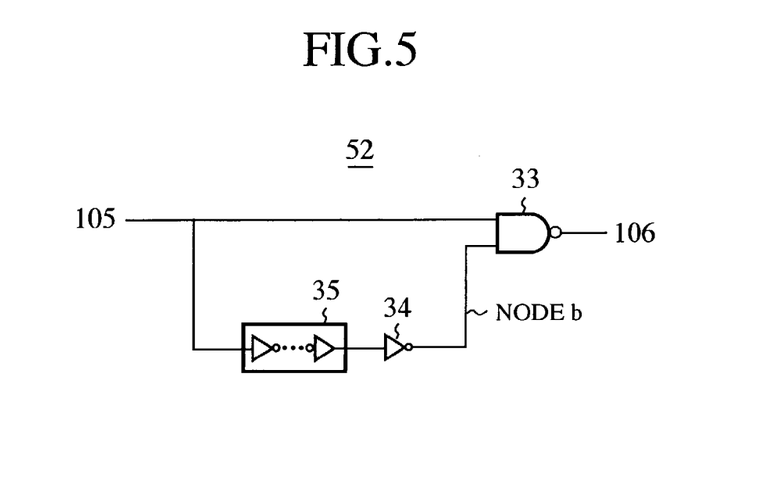
FIG. 5 is a block diagram showing a configuration of the setup signal generating circuit 52 of the embodiment 1.
Figure 6:
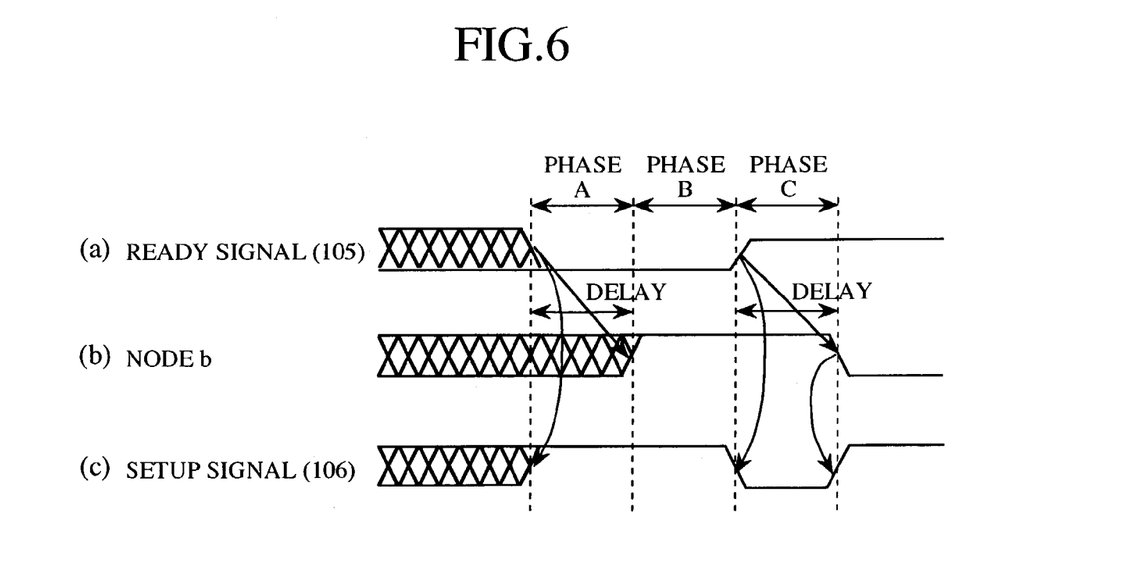
FIG. 6 is a timing chart illustrating the operation of the setup signal generating circuit 52 of the embodiment 1.

Subsequently, the setup signal generating circuit 52 starts operating, and the setup signal 106 enters awaiting state. FIG. 5 shows a configuration of the setup signal generating circuit 52. In FIG. 5, the reference numeral 33 designates a NAND gate, 34 designates an inverter, and 35 designates a delay element. FIG. 6 is a timing chart illustrating the operation of the setup signal generating circuit 52. In FIG. 6, it is necessary that the relationship phase A+phase B>phase C must be satisfied.

Subsequently, in the repair address memory operation phase B, the reset signal 104 is disabled, and the repair address memory 4 stores information to be carried by the repair address signal 102 and repair activating signal 103.

Subsequently, in the preparation phase C, the ready signal 105 enters the waiting state, and the setup signal generating circuit 52 starts operating so that the setup signal 106 becomes a busy state.

When the setup signal 106 becomes the busy state, the controller 5 has the transmission gate 15 in the address comparator 1 turn on, and the 2-to-1 selector 3 switch its input port to the input side of the repair address signal 102.

The address comparator 1 operates differently depending on whether the repair activating signal 103 stored in the repair address memory 4 indicates the "repair circuit used state" or "repair circuit unused state".

When the repair activating signal 103 indicates the "repair circuit used state", the repair address signal 102, which is supplied from the repair address memory 4 to the address decoder 2 via the 2-to-1 selector 3, is decoded by the address decoder 2. In addition, since the transmission gate 15 of the address comparator 1 is in the ON state, the repair address information output from the address decoder 2 is stored in the repair signal information holding section 12. In this case, the input signal node C of the AND gate 11 is maintained at "LOW" for the repair address selected, while it is maintained at "HIGH" for the other addresses.

On the other hand, when the repair activating signal 103 indicates the "repair circuit unused state", the repair signal information holding section 12 is reset, so that the node C of the repair signal information holding section 12 is maintained at "HIGH" for all the addresses.

Subsequently, in the normal operation phase D, the setup signal 106 enters a waiting state, and the transmission gate 15 in the address comparator 1 is turned off. In addition, when the setup signal 106 enters the waiting state, the 2-to-1 selector 3 switches its input port to the input side of the read/write address signal 101 (read/write target memory address signal).

Thus, the read/write address signal 101 is decoded by the address decoder 2, and the address comparator 1 compares the decoded output with the repair address information held by the repair signal information holding section 12.

The input signal node D of the AND gate 11 becomes "HIGH" for the address selected by the read/write address signal 101. If the address is the address that must be repaired, since the input signal node C of the AND gate 11 is maintained at "LOW" for that address, the memory cell selection signal 107 becomes an unselected state so that the corresponding memory cell is not activated.

In contrast, when the address selected by the read/write address signal 101 is the address that need not repair, since the input signal node C of the AND gate 11 is maintained at "HIGH" for the address, both the nodes C and D are "HIGH". Thus, the memory cell selection signal 107 is selected and the corresponding memory cell is activated.

Figure 7:
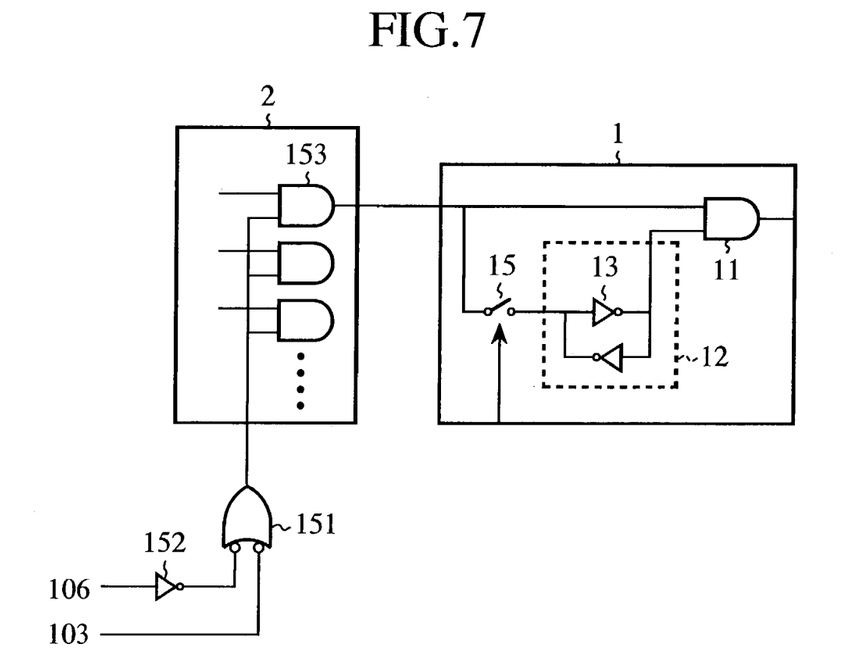
FIG. 7 is a block diagram showing a configuration of a variation of the embodiment 1 of the semiconductor memory unit with a repair circuit in accordance with the present invention.

Although the embodiment 1 employs a memory circuit with a reset function as the repair signal information holding section 12 in the address comparator 1, this is not essential. For example, the configuration of FIG. 7 enables a memory circuit without the reset function to be used as the repair signal information holding section 12. In FIG. 7, the address decoder 2 is provided at its output stage a function of inactivating the signal after the decoding in its entirety when the repair activating signal 103 is in the "repair circuit unused state". More specifically, the function is achieved by a NAND gate 151 that outputs a "0" signal only when the repair activating signal 103 is in the "repair circuit unused state" (HIGH) and the setup signal 106 is in the busy state (LOW), and by AND gates installed at the output stage of the address decoder 2 for inactivating the signal after the decoding in its entirety when the output of the NAND gate 151 is "0". In FIG. 7, the reference numeral 152 is an inverter for inverting the setup signal 106.

Figure 8:
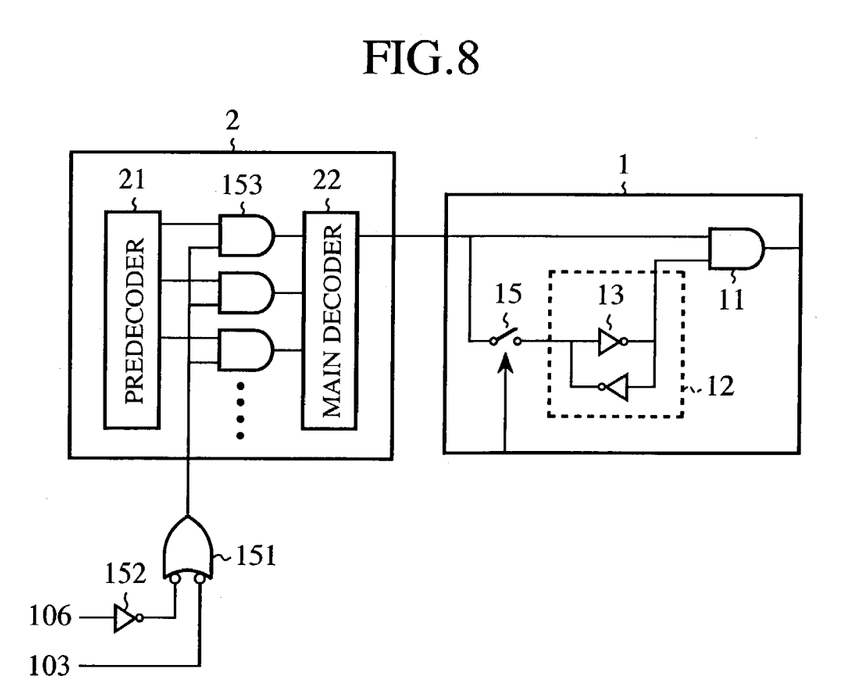
FIG. 8 is a block diagram showing a configuration of another variation of the embodiment 1 of the semiconductor memory unit with a repair circuit in accordance with the present invention.

Alternatively, the configuration of FIG. 8 also makes it possible to use a memory circuit without the reset function as the repair signal information holding section 12. In FIG. 8, the address decoder 2 includes a predecoder 21 and a main decoder 22, and the predecoder 21 is provided with a function of inactivating the signal after the predecoding in its entirety when the repair activating signal 103 is in the "repair circuit unused state". The function of inactivating the signal is achieved by the same configuration as that of FIG. 7.

As described above, the present embodiment 1 is configured such that the address comparator 1 includes the repair signal information holding section 12 for holding the repair address information supplied from the address decoder 2. In addition, it is configured such that when the 2-to-1 selector 3 is controlled to supply the address decoder 2 with the repair address signal 102 in response to the setup signal 106 output from the controller 5, the address comparator 1 is controlled to have the repair signal information holding section 12 hold the decoded repair address, and that when the 2-to-1 selector 3 is controlled to supply the address decoder 2 with the read/write address signal 101, the address comparator 1 is controlled to compare the read/write address with the repair address. Accordingly, the present embodiment 1 can obviate the need for the repair address decoder, thereby offering an advantage of being able to reduce the unit area.

Embodiment 2

Although the foregoing embodiment 1 includes only one repair address memory, the present embodiment 2 includes a plurality of repair address memories within the unit.

Figure 9:
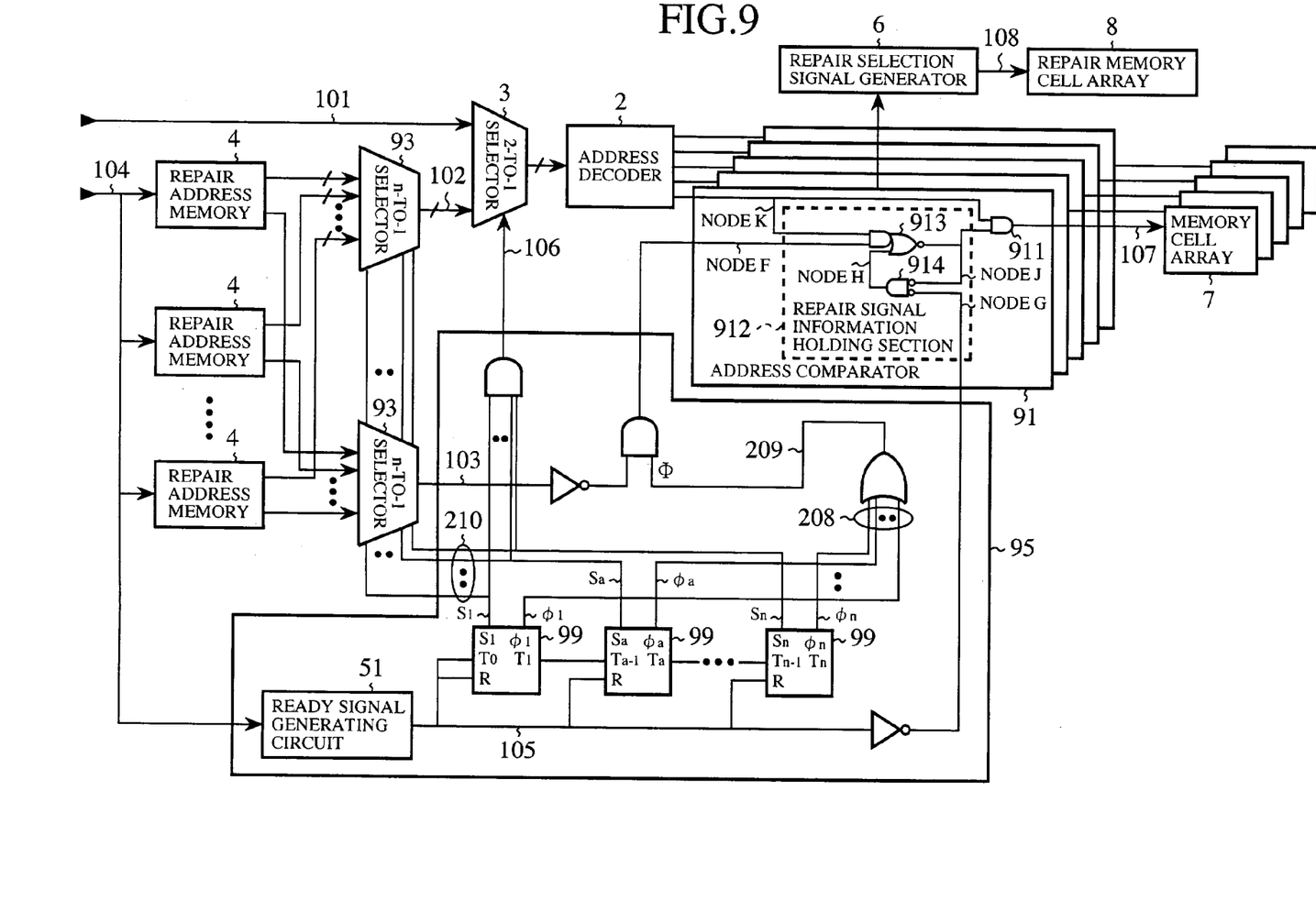
FIG. 9 is a block diagram showing a configuration of an embodiment 2 of the semiconductor memory unit with a repair circuit in accordance with the present invention.

FIG. 9 is a block diagram showing a configuration of the embodiment 2 of the semiconductor memory unit with a repair circuit in accordance with the present invention. In FIG. 9, the same reference numerals as those of FIG. 1 designate the same or like components to those of FIG. 1. In FIG. 9, the reference numeral 91 designates an address comparator, each reference numeral 93 designates an n-to-1 selector, and the reference numeral 95 designates a controller. Although each repair address memory 4 is the same as that of the embodiment 1, the embodiment 2 includes n repair address memories 4. Each reference numeral 99 designates a $\phi a$ and Sa signal generating circuit. The present embodiment 2 includes n $\phi a$ and Sa signal generating circuits. The reference numeral 911 designates an AND gate, 912 designates a repair signal information holding section, 913 designates an AND-NOR gate, and 914 designates a NOR gate.

The address comparator 91 includes the AND gates 911 and the repair signal information holding sections 912. The repair signal information holding section 912 includes the AND-NOR gate 913 and the NOR gate 914. The controller 95 includes the ready signal generating circuit 51 and the n $\phi a$ and Sa signal generating circuits 99.

Next, the operation of the present embodiment 2 will be described.

Figure 10:
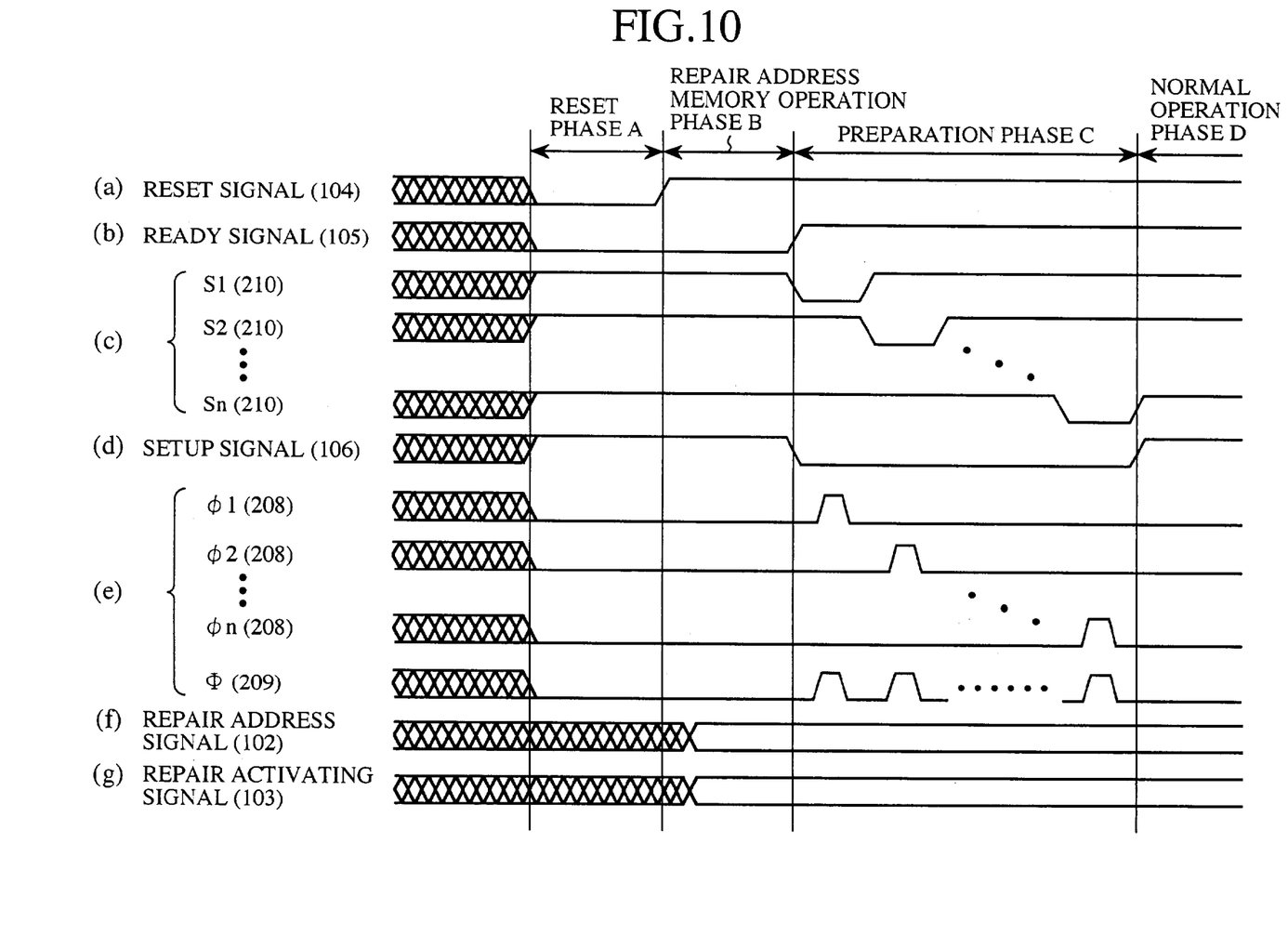
FIG. 10 is a timing chart illustrating the operation of the embodiment 2 of the semiconductor memory unit with a repair circuit.

FIG. 10 is a timing chart illustrating the operation of the embodiment 2 of the semiconductor memory unit with a repair circuit in accordance with the present invention.

As the foregoing embodiment 1, the operation of the embodiment 2 includes the four phases. FIG. 10 illustrates the states of the reset signal 104, ready signal 105, n-to-1 selector control signal 210 (S1–Sn in FIG. 10), setup signal 106, state write pulse signals 208 and 209 ($\phi 1$–$\phi n$ and $\Phi$ in FIG. 10), repair address signal 102, and repair activating signal 103 in the individual phases. Referring to FIGS. 9 and 10, the operation in the individual phases will be described.

Figure 11:
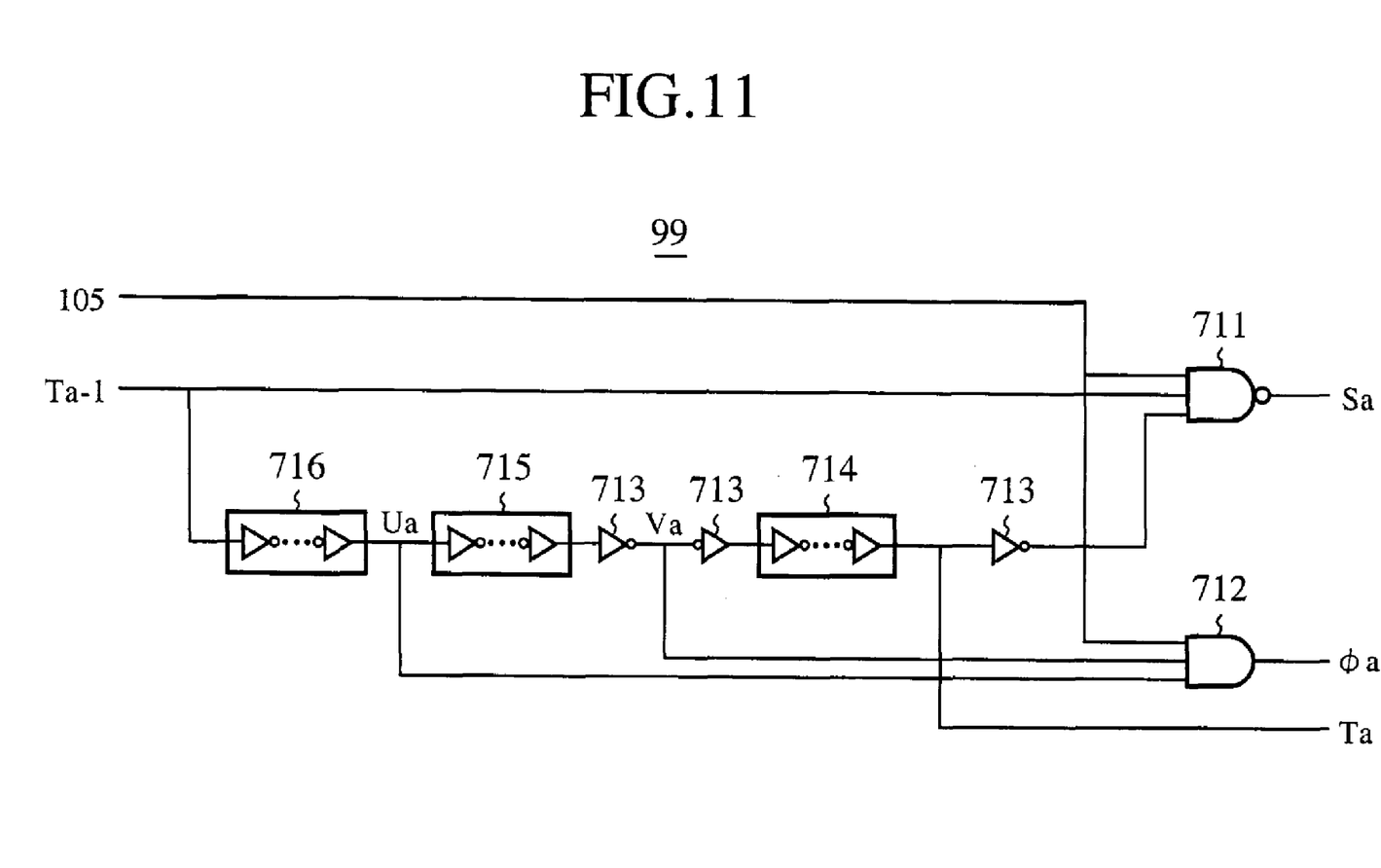
FIG. 11 is a block diagram showing a configuration of the φa signal and Sa signal generating circuit 99a of the embodiment 2.
Figure 12:
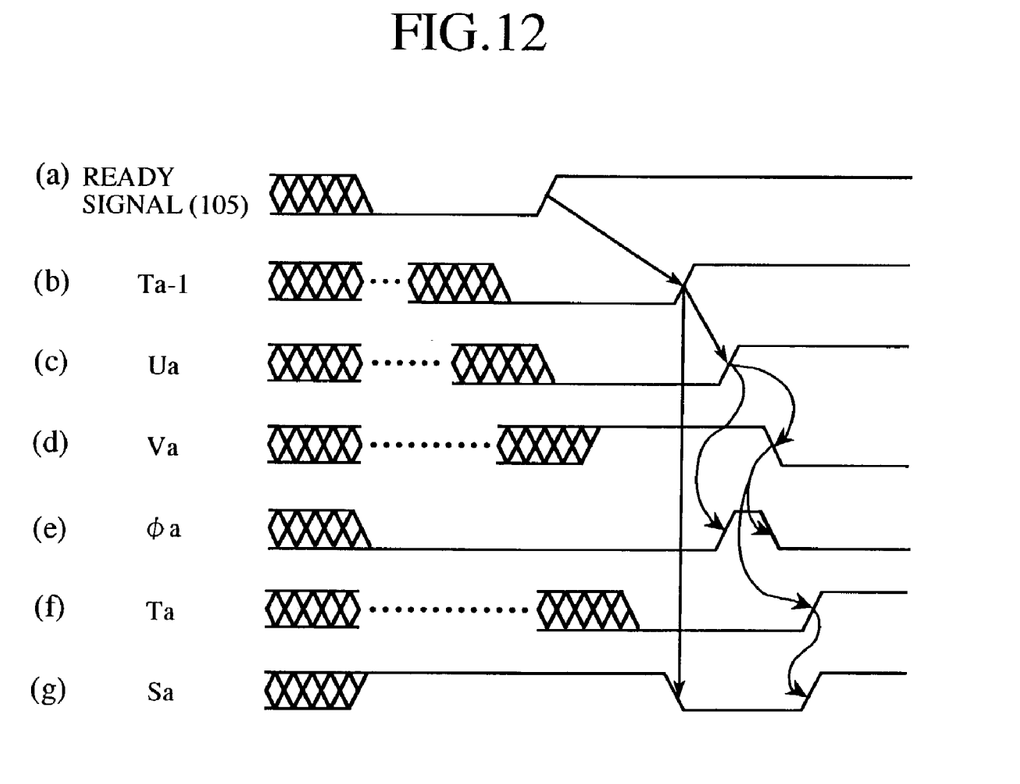
FIG. 12 is a timing chart illustrating the operation of the φa signal and Sa signal generating circuit 99 of the embodiment 2.

In the reset phase A, the reset signal 104 supplied from the outside of the unit is enabled so that the ready signal generating circuit 51 starts its operation, and the ready signal 105 enters the busy state. In contrast, the signals $\phi 1$–$\phi n$ and $\Phi$ indicate the waiting state. FIG. 11 shows a configuration of the $\phi a$ and Sa signal generating circuit 99. In FIG. 11, the reference numeral 711 designates a NAND gate and 712 designates an AND gate. Each reference numeral 713 designates an inverter. The reference numeral 714 designates a delay circuit A, 715 designates a delay circuit B, and 716 designates a delay circuit C. FIG. 12 is a timing chart illustrating the operation of the $\phi a$ and Sa signal generating circuit 99.

In the repair address memory operation phase B, the reset signal 104 is disabled so that the repair address memories 4 each store the information to be carried by the repair address signal 102 and repair activating signal 103. Here, since the signals $\phi 1$–$\phi n$ and $\Phi$ are in the waiting state "LOW", the node F is placed at "LOW". In addition, since the ready signal 105 is "LOW", the node G is placed at "HIGH" and the node H is placed at "LOW". Since both the nodes H and F are "LOW", the node J is placed at "HIGH" so that the repair signal information holding section 912 is reset.

In the preparation phase C, the ready signal 105 enters the waiting state. The $\phi a$ and Sa signal generating circuit 99 starts operating, and the signal S1 enters the busy state. When the signal S1 enters the busy state, the setup signal 106 enters the busy state. In addition, when the signal S1 enters the busy state, the n-to-1 selector 93 switches its input port to the first port. Thus, the information about the repair activating signal, which is stored in the first repair address memory 4, is read as the repair activating signal 103. When the pulse of the signal $\phi 1$ is transmitted as the signal $\Phi$, and if the repair activating signal 103 is in the active state, the node F is placed at "HIGH".

When the setup signal 106 enters the busy state, the 2-to-1 selector 3 switches its input port to the input side of the repair address signal 102. Thus, the repair address signal 102 stored in the first repair address memory 4 is decoded by the address decoder 2. Here, in the repair signal information holding section 912 in the address comparator 91, when both the nodes F and K are at "HIGH", the node J is placed at "LOW". When the node K is at "LOW", the node J holds the previous value.

Subsequently, as soon as the signal S1 enters the waiting state, the signal S2 enters the busy state so that the repair address information stored in the second repair address memory 4 is stored in the repair signal information holding section 912 in the same procedure as described above. The process is repeated by n times.

Subsequently, in the normal operation phase D, the setup signal 106 enters the waiting state. In addition, since the signal $\Phi$ becomes "LOW", the node F is placed at "LOW". Furthermore, since the setup signal 106 enters the waiting state, the 2-to-1 selector 3 switches its input port to the input side of the read/write address signal 101.

Then, the address decoder 2 decodes the information carried by the read/write address signal 101, and the address comparator 91 compares the decoded data with the repair address information held by the repair signal information holding section 912.

The input signal node K of the AND gate 911 becomes "HIGH" for the address selected by the read/write address signal 101. When the address is the address that must be repaired, since the node J is maintained at "LOW" for the address, the memory cell selection signal 107 is unselected, and the corresponding memory cell is not activated.

In contrast, when the address selected by the read/write address signal 101 is the address that need not repair, since the node J is held at "HIGH" for the address, the memory cell selection signal 107 is selected, and the corresponding memory cell is activated.

Although the present embodiment 2 controls the write operation to the repair signal information holding section 912 in the address comparator 91 by the logic operation between the repair activating signal 103 and signal Φ, this is not essential. For example, the address decoder 2 can include the function for inactivating all the signals after the decoding at its output stage as shown in FIG. 7 so that the write operation to the repair signal information holding section 912 is controlled by only the signal Φ. In addition, the address decoder 2 can be configured such that it includes the predecoder 21 and the main decoder 22 as shown in FIG. 8. Specifically, it can provide the predecoder 21 with the function of inactivating all the signals after the predecoding so that the write operation to the repair signal information holding section 912 is controlled by only the signal Φ.

As described above, the present embodiment 2 is configured such that the controller 95 outputs the n-to-1 selector control signal 210 to select one of the outputs of the repair address memories 4, and supplies it to the address decoder 2 as the repair address signal 102, and that the repair signal information holding section 912 is controlled to store the repair address information in response to the state write pulse signal 209. Thus, the present embodiment 2 offers advantages of being able to obviate the need for installing the repair address decoder, to reduce the unit area, and to cope with the case where a plurality of the repair address memories are installed.

What is claimed is:

1. A semiconductor memory unit with a repair circuit that compares a read/write target memory address with a repair target memory address, and activates, when the two addresses agree with each other, a corresponding repair memory instead of a corresponding read/write target memory, said semiconductor memory unit with a repair circuit comprising:
    at least one repair address memory for storing the repair target memory address;
    a shared address decoder for decoding a read/write target memory address signal supplied from outside, and repair target memory address signal output from said repair address memory;
    a selector for selecting one of the read/write target memory address signal and the repair target memory address signal to be supplied to said shared address decoder;
    an address comparator that includes a repair signal information holding section for holding the repair target memory address decoded by said shared address decoder, and compares the repair target memory address with the read/write target memory address decoded by said shared address decoder; and
    a controller for supplying said selector and said address comparator with a control signal, wherein when said selector is controlled to supply said shared address decoder with the repair target memory address signal by said control signal, said address comparator is controlled to have said repair signal information holding section hold the repair target memory address in response to the control signal, and wherein when said selector is controlled to supply said shared address decoder with the read/write target memory address signal by said control signal, said address comparator is controlled to compare the read/write target memory address with the repair target memory address in response to the control signal.

2. The semiconductor memory unit with a repair circuit according to claim 1, wherein said semiconductor memory unit includes a plurality of repair address memories, wherein when said selector is controlled to supply said shared address decoder with the repair target memory address signal output from said plurality of repair address memories in a time sharing manner, said address comparator is controlled to have said repair signal information holding section hold the repair target memory addresses in response to the control signal, and wherein when said selector is controlled to supply said shared address decoder with the read/write target memory address signal, said address comparator is controlled to compare the read/write target memory address with the repair target memory address in response to the control signal.

3. The semiconductor memory unit with a repair circuit according to claim 1, wherein said repair signal information holding section consists of a memory circuit with a reset function, and wherein said repair address memory supplies said repair signal information holding section with a repair activating signal indicating whether the repair circuit is to be used or not, and resets said repair signal information holding section when the repair activating signal indicates a repair circuit unused state.

4. The semiconductor memory unit with a repair circuit according to claim 1, wherein said repair signal information holding section consists of a memory circuit without a reset function, and wherein said shared address decoder comprises means for inactivating a decoded signal in its entirety when a repair activating signal indicating whether the repair circuit is to be used or not indicates a repair circuit unused state.

5. The semiconductor memory unit with a repair circuit according to claim 1, wherein said repair signal information holding section consists of a memory circuit without a reset function, and said shared address decoder comprises a predecoder and a main decoder, and wherein said predecoder includes means for inactivating a predecoded signal in its entirety when a repair activating signal indicating whether the repair circuit is to be used or not indicates a repair circuit unused state.

* * * * *